United States Patent
Kim

(10) Patent No.: US 7,218,042 B2
(45) Date of Patent: May 15, 2007

(54) PLASMA DISPLAY PANEL

(75) Inventor: Yoon-hyeo Kim, Gunpo-si (KR)

(73) Assignee: Samsung Electronics Co. Ltd., Gyeonggi-do (KR)

( * ) Notice: Subject to any disclaimer, the term of this patent is extended or adjusted under 35 U.S.C. 154(b) by 186 days.

(21) Appl. No.: 10/820,154

(22) Filed: Apr. 8, 2004

(65) Prior Publication Data

US 2004/0256987 A1    Dec. 23, 2004

(30) Foreign Application Priority Data

Jun. 20, 2003   (KR) ...................... 10-2003-0040102

(51) Int. Cl.
*H01J 17/49*   (2006.01)
(52) U.S. Cl. .......................... 313/46; 313/582; 313/11; 313/44; 313/45
(58) Field of Classification Search ............ 313/45–46, 313/11, 44, 582
See application file for complete search history.

(56) References Cited

U.S. PATENT DOCUMENTS

| | | | | |
|---|---|---|---|---|
| 4,520,290 A | * | 5/1985 | Cokefair | 313/15 |
| 4,663,564 A | * | 5/1987 | Kobale et al. | 313/551 |
| 6,369,706 B1 | * | 4/2002 | Anderson et al. | 340/521 |
| 6,885,412 B2 | * | 4/2005 | Ohnishi et al. | 349/72 |

FOREIGN PATENT DOCUMENTS

| | | |
|---|---|---|
| JP | 9-6283 A | 1/1997 |
| JP | 11-233028 A | 8/1999 |
| JP | 11233028 A * | 8/1999 |

* cited by examiner

*Primary Examiner*—Nimeshkumar D. Patel
*Assistant Examiner*—Anthony Perry
(74) *Attorney, Agent, or Firm*—Sughrue Mion, PLLC

(57) ABSTRACT

Provided is a plasma display panel (PDP) including a rear substrate and a front substrate, which are spaced a predetermined distance apart from each other to face each other and between which a plurality of discharge cells are formed. A heating portion is disposed in the rear of the rear substrate to heat the rear substrate and the front substrate.

17 Claims, 4 Drawing Sheets

PLASMA DISPLAY PANEL

This application claims the priority of Korean Patent Application No. 2003-40102, filed on Jun. 20, 2003, in the Korean Intellectual Property Office, the disclosure of which is incorporated herein by reference in its entirety.

BACKGROUND OF THE INVENTION

1. Field of the Invention

Apparatuses and methods consistent with the present invention relate to a plasma display panel (PDP), and more particularly, to a plasma display panel that prevents low discharge at low temperature.

2. Description of the Related Art

In general, a plasma display panel (PDP), which is a picture display device using electric discharge, has high luminance and wide visible angle and thus is widely used as a flat panel display. The plasma display panel emits visible rays by injecting gases between two substrates having electrodes thereon, discharging the gases between the electrodes by applying a direct-current (DC) voltage or an alternate-current (AC) voltage, and exciting phosphors using ultraviolet (UV) rays generated by the discharged gases.

A plasma display panel is classified into a DC type and an AC type according to the discharge type. The DC type plasma display panel is constructed such that all electrodes are exposed to a discharge space and thus a migration of charges directly occurs between the corresponding electrodes. On the other hand, the AC type plasma display panel is constructed such that at least one electrode is covered by a dielectric layer, and there is no direct migration of charges between the corresponding electrodes. Instead, ions and electrons produced by the discharge adhere to the surface of the dielectric layer to form wall charges.

Also, a plasma display panel is classified into an opposite discharge type and a surface discharge type according to the type of arrangement of electrodes. In the opposite discharge plasma display panel, a pair of sustaining electrodes are disposed on a front substrate and a rear substrate, respectively, and a discharge occurs in a direction of a vertical axis of the panel. On the other hand, in the surface discharge plasma display panel, a pair of sustaining substrates are disposed on the same substrate, and a discharge occurs on a flat surface of the substrate.

The opposite discharge plasma display panel has high luminous efficiency but a phosphor layer is easily degraded by plasma and a discharge requires high voltage. For this reason, the surface discharge plasma display panel has been generally used.

FIGS. 1 and 2 illustrate a conventional AC type plasma display panel. FIG. 2 illustrates a sectional structure of the plasma display panel of FIG. 1, in which a front substrate is rotated by 90°.

Referring to FIGS. 1 and 2, the conventional AC type plasma display panel has a rear substrate 10 and a front substrate 20.

A plurality of stripe-shaped address electrodes 11 are formed on a top surface of the rear substrate 10 and are covered by a first dielectric layer 12. A plurality of partitions 13 are formed on the first dielectric layer 12 to be spaced a predetermined distance apart from each other in order to prevent electric and optical crosstalk between discharge cells 14. Red (R), green (G), and blue (B) phosphor layers 15 are formed to a predetermined thickness on an inner surface of the discharge cells 14 defined by the partitions 13. A discharge gas containing one selected from Ne, Xe, and a gas mixture thereof is injected into the discharge cells 14.

The front substrate 20 is a transparent substrate generally formed of glass, through which visible rays can pass, and is combined with the rear substrate 10 on which the partitions 13 are formed. Stripe-shaped sustaining electrodes 21a and 21b are formed on a bottom surface of the front substrate 20 perpendicular to the address electrodes 11. The sustaining electrodes 21a and 21b are formed of a transparent transmission material, such as indium tin oxide (ITO), so as to increase optical transmitivity. Also, bus electrodes 22a and 22b, formed of metal, are formed on bottom surfaces of the sustaining electrodes 21a and 21b, respectively, to have a smaller width than the sustaining electrodes 21a and 21b to reduce line resistances of the sustaining electrodes 21a and 21b. The sustaining electrodes 21a and 21b and the bus electrodes 22a and 22b are covered by a second dielectric layer 23, and a protective layer 24 is formed on a bottom surface of the second dielectric layer 23. The protective layer 24, such as a MgO layer, prevents damage of the second dielectric layer 23 due to plasma sputtering and emits secondary electrons to reduce discharge voltage and sustaining voltage.

An operating timing of the conventional plasma display panel comprises a resetting period, an addressing period, and a sustaining period. In the resetting period, a charge state of all of the discharge cells is initialized to allow efficient addressing of the discharge cells 14. In the addressing period, an address discharge occurs between the address electrode 11 and one sustaining electrode 21b (i.e., a Y electrode) in a selected discharge cell 14, thereby accumulating wall charges. In the sustaining period, a sustaining discharge occurs between the Y electrode 21b and another sustaining electrode 21a (i.e., an X electrode) in the discharge cell 14 including the wall charges. In the sustaining period, the phosphor layer 15 of the discharge cell 14 is excited using ultraviolet rays generated by discharge gases, to allow the plasma display panel to emit visible rays. The visible rays are radiated through the front substrate 20 to form images recognized by a user.

The yield of plasma display panels is determined by the uniform discharge characteristic of panels and greatly affects the panels' cost. In the conventional plasma display panel, the protective layer 24 is formed by depositing MgO. However, if the protective layer 24 is formed of MgO, low discharge occurs at a low temperature of 0° C. or less.

SUMMARY OF THE INVENTION

The present invention provides a plasma display panel, which is maintained at a constant temperature through a heating portion when the plasma display panel operates at low temperature.

In accordance with an aspect of the present invention, there is provided a plasma display panel comprising a rear substrate and a front substrate, wherein the rear substrate is spaced a predetermined distance apart from the front substrate and wherein the rear substrate faces the front substrate, and a plurality of discharge cells are formed between the front substrate and the rear substrate. Also, a heating portion for heating the rear substrate and the front substrate is disposed at a rear of the rear substrate.

The heating portion may comprise a heat generating body and a controlling portion for controlling the heat generating body to generate heat only at a predetermined temperature or less.

The controlling portion may comprise a circuit portion for allowing a current to flow into the heat generating body according to a sensed temperature. Also, the circuit portion may comprise a thermistor having a resistance, wherein the resistance varies according to the sensed temperature, and a field effect transistor for allowing the current to flow into the heat generating body according to a level of the resistance of the thermistor.

The heat generating body may be a heat generating coil, and the predetermined temperature is approximately 0° C.

In accordance with another aspect of the present invention, there is provided a plasma display panel comprising a rear substrate and a front substrate, wherein the rear substrate is spaced a predetermined distance apart from the front substrate and wherein the rear substrate faces the front substrate, and a plurality of discharge cells are formed between the front substrate and the rear substrate; a plurality of first electrodes formed on an inner surface of the rear substrate; a first dielectric layer formed on the inner surface of the rear substrate to cover the plurality of the first electrodes; a plurality of partitions formed on a surface of the first electric layer to define the discharge cells; a phosphor layer formed on sidewalls of the partitions and on a surface of the first dielectric layer; a plurality of second electrodes formed on an inner wall of the front substrate, corresponding to the plurality of the first electrodes; a second dielectric layer formed on the inner wall of the front substrate to cover the plurality of the second electrodes; a protective layer formed on a surface of the second dielectric layer; and a heating portion disposed at a rear of the rear substrate to heat the rear substrate and the front substrate.

The heating portion may comprise a heat generating body and a controlling portion for controlling the heat generating body to heat only at a predetermined temperature or less.

The controlling portion may comprise a circuit portion for allowing a current to flow into the heat generating body according to a sensed temperature. Also, the circuit portion may comprise a thermistor having a resistance, wherein the resistance varies according to the sensed temperature, and a field effect transistor, wherein the field effect transistor allows the current to flow into the heat generating body according to a level resistance of the thermistor.

The protective layer is preferably, but not necessarily, formed of MgO.

The heat generating body comprises a heat generating coil, and the predetermined temperature is approximately 0° C.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
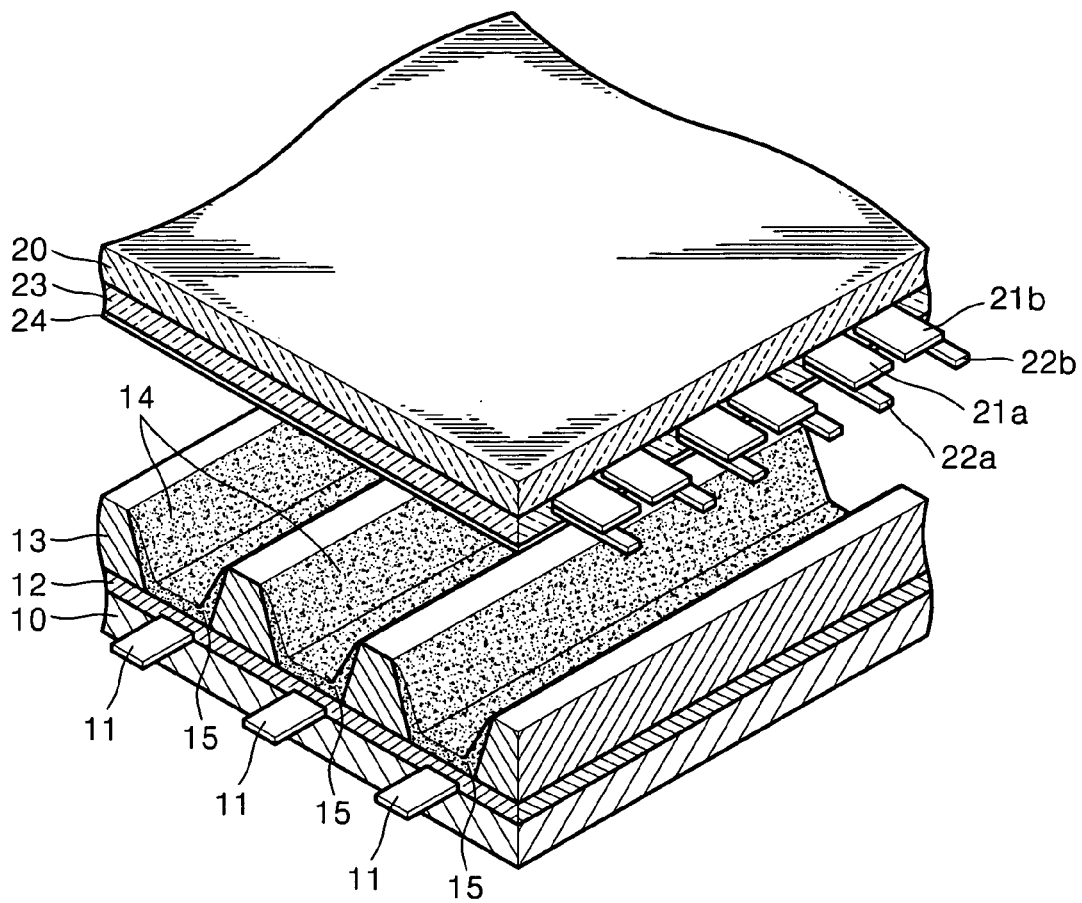
FIG. 1 is a partial perspective view of a conventional AC type plasma display panel.
Figure 2:
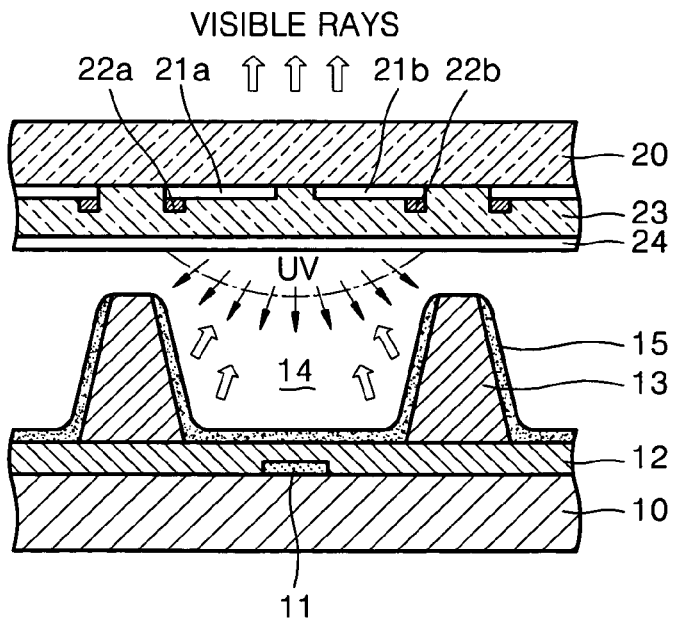
FIG. 2 is a sectional view of the plasma display panel of FIG. 1, in which a front substrate is rotated by 90°.

The present invention will be described more fully with reference to the accompanying drawings, in which exemplary embodiments of the invention are shown. In the drawings, the thicknesses of layers may be exaggerated for clarity, and the same reference numerals are used to denote the same elements throughout the drawings.

Figure 3:
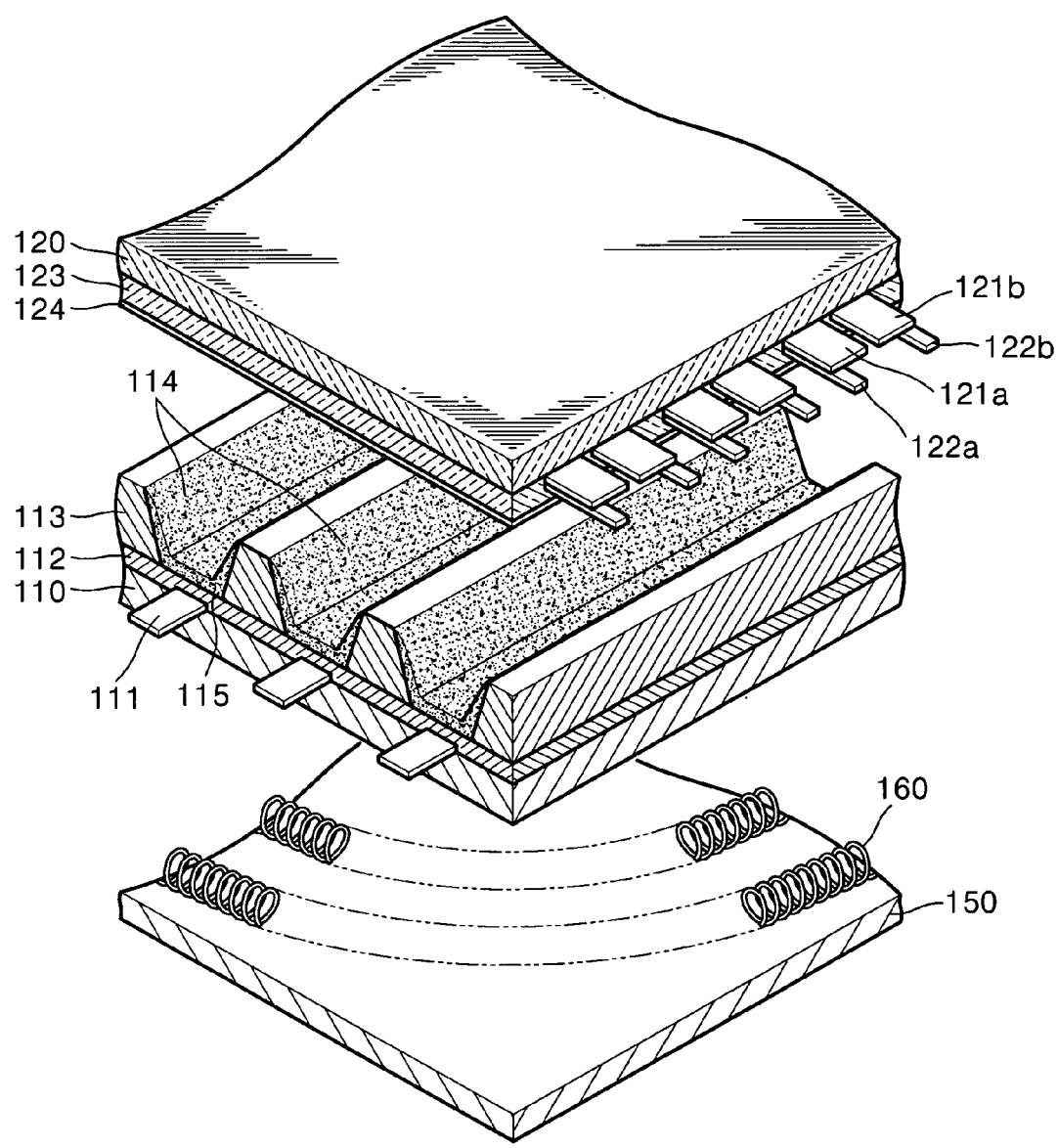
FIG. 3 is a partial perspective view of a plasma display panel according to an embodiment of the present invention.

FIG. 3 illustrates a plasma display panel according to an embodiment of the present invention.

Referring to FIG. 3, the plasma display panel of the present invention comprises a rear substrate 110 and a front substrate 120, which are disposed to face each other. A heating portion for heating the rear substrate 110 and the front substrate 120 is disposed in the rear of the rear substrate 110.

The rear substrate 110 and the front substrate 120 are spaced a predetermined distance apart from each other, and a plurality of discharge cells 114 are formed therebetween.

The rear substrate 110 may be a glass substrate, and a plurality of stripe-shaped first electrodes 111 are formed on an inner surface of the rear substrate 110. Each of the first electrodes 111 is an address electrode, which is formed of a material having high conductivity and low resistance, such as Ag, Al, or Cu.

The first electrodes 111 are covered by a first dielectric layer 112 formed on the inner surface of the rear substrate 110. The first dielectric layer 112 is formed of a white-colored dielectric material so as to reflect visible rays radiated from the discharge cells 114.

A plurality of partitions 113 are formed on a surface of the first dielectric layer 112 between the first electrodes 111. The partitions 113 define the discharge cells 114 to prevent electric and optical crosstalk between the discharge cells 114. A discharge gas containing Ne, Xe, or a gas mixture thereof is injected into the discharge cells 114 defined by the partitions 113. Also, red (R), green (G), and blue (B) phosphor layers 115 are formed to a predetermined thickness on sidewalls of the partitions 113, which surround the discharge cells 114, and on the surface of the first dielectric layer 112.

The front substrate 120 is formed of a transparent substrate, through which visible rays can pass, generally, a glass substrate. A plurality of stripe-shaped second electrodes 121a and 121b are formed so as to correspond to the first electrodes 111. The second electrodes 121a and 121b are pairs of sustaining electrodes, which are formed perpendicular to the first electrodes 111. The second electrodes 121a and 121b are formed of a transparent conductive material, for example, indium tin oxide (ITO), through which visible rays irradiated from the discharge cells 114 can pass. Since the ITO has a relatively high resistance, bus electrodes 122a and 122b are formed on bottom surfaces of the second electrodes 121a and 121b, respectively, to have a smaller width than the second electrodes 121a and 121b so as to reduce line resistances of the second electrodes 121a and 121b. Here, the bus electrodes 122a and 122b are formed of metal having high conductivity.

The second electrodes 121a and 121b are covered by a second dielectric layer 123, which is formed on an inner wall of the front substrate 120. Here, the bus electrodes 122a and 122b also are covered by the second dielectric layer 123. The second dielectric layer 123 is formed of a transparent dielectric material that visible rays can transmit. Also, a protective layer 124 is formed on a surface of the second dielectric layer 123. The protective layer 124 prevents damage of the second dielectric layer 123 and the second electrodes 121*a* and 121*b* due to plasma sputtering and emits secondary electrons to reduce discharge voltage and sustaining voltage. The protective layer 124 is formed by depositing MgO.

A heating portion is disposed in the rear of the rear substrate 110. The heating portion is adopted to solve low discharge, which occurs when the plasma display panel operates at a low temperature of, for example, 0° C. or less. The heating portion can heat the rear substrate 110 and the front substrate 120 for a certain amount of time under condition of low-temperature operation causing low discharge, thereby holding the plasma display panel at a constant temperature for the certain time.

The heating portion comprises a heat generating body and a controlling portion for controlling the heat generating body to generate heat only at a predetermined temperature of, for example, 0° C. or less.

Figure 4:
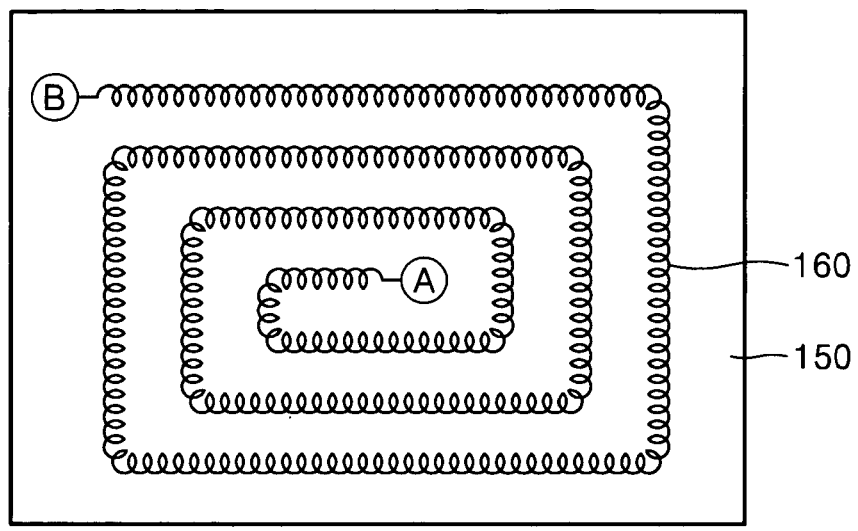
FIG. 4 is a plan view of a heat generating coil mounted under a rear substrate.

In the present invention, a heat generating coil 160 is used as the heat generating body, and FIG. 4 is a plan view of the heat generating coil 160. In FIGS. 3 and 4, reference numeral 150 denotes a base on which the heat generating coil 160 is mounted. Meanwhile, in the plasma display panel of the present invention, a semiconductor or other heat generating resistor can be used as the heat generating body in place of the heat generating coil 160.

The controlling portion comprises a circuit portion, which is used to sense temperature and allows current to flow into the heat generating coil 160. This circuit portion is shown in FIG. 5.

Figure 5:
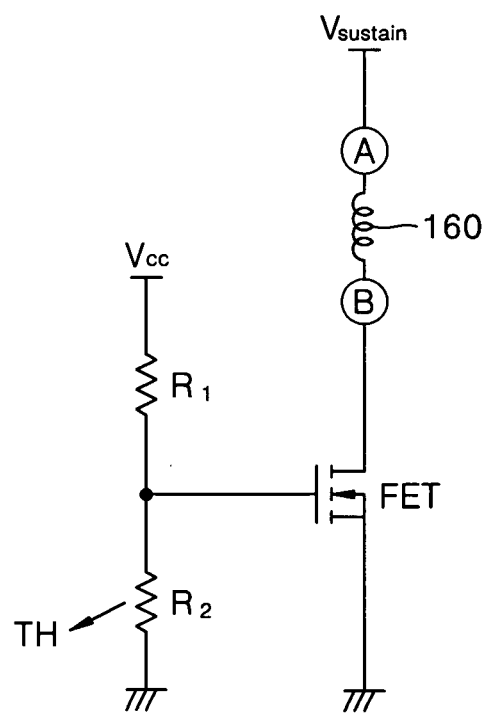
FIG. 5 is a diagram of a circuit portion for controlling current flowing into the heat generating coil of FIG. 4.
Figure 6:
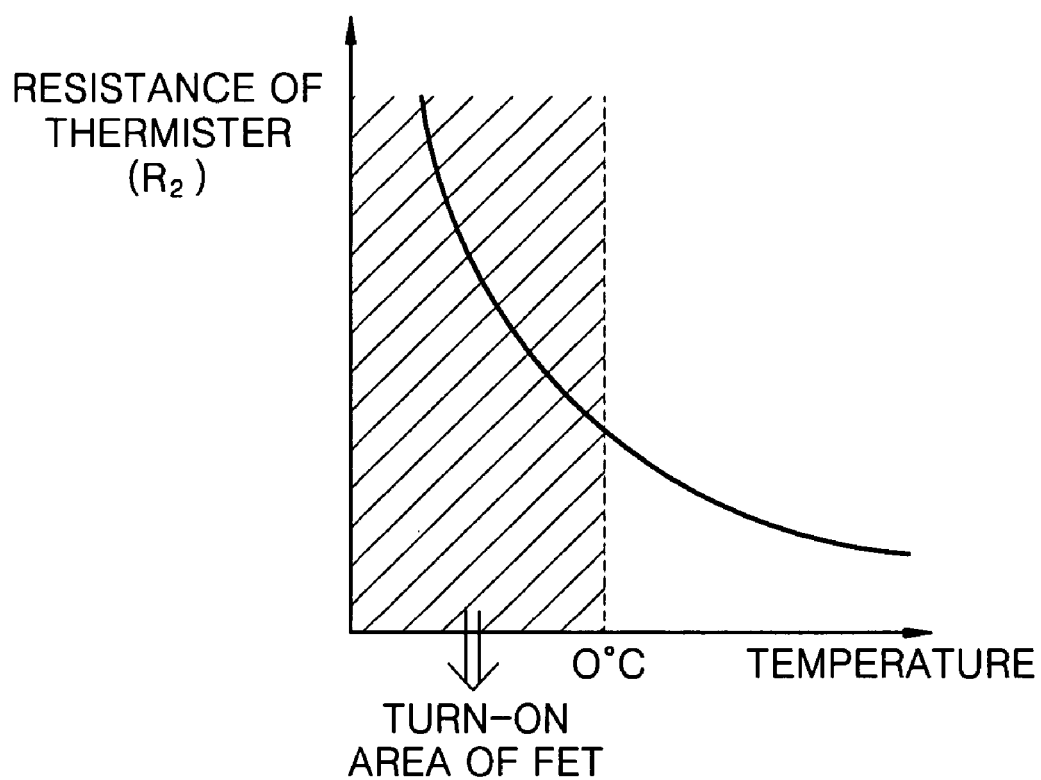
FIG. 6 is a graph showing a resistance variation according to the temperature of a thermistor.

Referring to FIG. 5, the circuit portion comprises a thermistor (TH), of which resistance $R_2$ varies according to the temperature, and a field effect transistor (FET), which allows current to flow into the heat generating coil 160. The thermistor TH is a semiconductor device, which can detect temperature by using a variation in resistance. FIG. 6 is a graph showing a variation of resistance $R_2$ of the thermistor TH according to the temperature. Referring to FIG. 6, the resistance $R_2$ of the thermistor TH was markedly reduced with an increase in temperature. By using this characteristic of the thermistor TH, if the FET is turned on at a predetermined temperature of, for example, 0° C. or less, current can flow into the heat generating coil 160.

Hereinafter, the principle of the heat generating coil 160, which generates heat at a temperature of, for example, 0° C. or less, will be described with reference to FIG. 5.

Initially, a circuit is constructed such that sustaining voltage $V_{sustain}$ allows current to flow into the heat generating coil 160. An FET is connected to this circuit to allow current to flow into the heat generating coil 160 according to the applied voltage. Meanwhile, the FET is connected to a circuit including resistors $R_1$ and $R_2$, to which supply voltage $V_{cc}$ is applied. Here, $R_2$ is a resistance of the thermistor TH and is markedly reduced with an increase in temperature.

In this construction, when the plasma display panel starts to operate at a low temperature of, for example, 0° C. or less, the $R_2$ of the thermistor TH increases such that more than threshold voltage is applied to the FET. Thus, the FET is turned on to allow current to flow into the heat generating coil 160. Accordingly, the inner temperature of the plasma display panel rises up, thereby solving low discharge, which occurs when the plasma display panel operates at low temperature.

Next, after the plasma display panel starts to operate, when its inner temperature increases in time to be more than a certain temperature, the $R_2$ of the thermistor TH is reduced.

Thus, the FET is turned off to stop current from flowing into the heat generating coil 160. In this state, since the inner temperature of the plasma display panel is already increased, no low discharge occurs.

If the plasma display panel operates at a normal temperature of, for example, more than 0° C., the FET remains turned off due to the foregoing characteristic of the thermistor TH, such that current does not flow into the heat generating coil 160.

Meanwhile, instead of the thermistor of which resistance is reduced with an increase in temperature, the plasma display panel of the present invention may operate using a thermistor of which resistance is proportional to temperature. In this case, an FET, which is turned on at a threshold voltage or less, is required.

Also, in the plasma display panel of the present invention, various heat generating resistors can be used as heat generating bodies instead of the foregoing heat generating coil, and various other controlling portions for controlling the heat generating coil can be used instead.

As explained thus far, in the present invention, a heating portion is installed in the rear of a rear substrate. Thus, the inner temperature of the plasma display panel can be increased through a heat generating coil only when the plasma display panel operates at low temperature to cause low discharge. Thus, the low discharge can be improved.

While the present invention has been described in connection with specific and exemplary embodiments thereof, it is capable of various changes and modifications without departing from the spirit and scope of the invention. It should be appreciated that the scope of the invention is not limited to the detailed description of the invention hereinabove, which is intended merely to be illustrative, but includes the subject matter defined by the following claims.

What is claimed is:

1. A plasma display panel comprising a rear substrate and a front substrate, wherein the rear substrate is spaced a predetermined distance apart from the front substrate and wherein the rear substrate faces the front substrate, and a plurality of discharge cells are formed between the front substrate and the rear substrate, the plasma display panel comprising:
   a heating portion disposed at a rear of the rear substrate to heat the rear substrate and the front substrate,
   wherein the heating portion comprises a thermistor having a resistance, wherein the resistance varies according to a sensed temperature, and a field effect transistor allowing a current to flow in the heating portion to generate heat according to a level of the resistance of the thermistor.

2. The plasma display panel of claim 1, wherein the heating portion comprises a heat generating body and a controlling portion for controlling the heat generating body to generate heat only at a predetermined temperature or less.

3. The plasma display panel of claim 2, wherein the controlling portion comprises a circuit portion for allowing a current to flow into the heat generating body according to a sensed temperature.

4. The plasma display panel of claim 2, wherein the heat generating body comprises a heat generating coil.

5. The plasma display panel of claim 2, wherein the predetermined temperature is approximately 0° C.

6. A plasma display panel comprising:
   a rear substrate and a front substrate, wherein the rear substrate is spaced a predetermined distance apart from the front substrate and wherein the rear substrate faces the front substrate, and a plurality of discharge cells are formed between the front substrate and the rear substrate;

a plurality of first electrodes formed on an inner surface of the rear substrate;

a first dielectric layer formed on the inner surface of the rear substrate, to cover the plurality of the first electrodes;

a plurality of partitions formed on a surface of the first dielectric layer to define the discharge cells;

a phosphor layer formed on sidewalls of the partitions and on a surface of the first dielectric layer;

a plurality of second electrodes formed on an inner wall of the front substrate, corresponding to the plurality of the first electrodes;

a second dielectric layer formed on the inner wall of the front substrate to cover the plurality of the second electrodes;

a protective layer formed on a surface of the second dielectric layer; and a heating portion disposed at a rear of the rear substrate to heat the rear substrate and the front substrate, wherein the heating portion comprises a thermistor having a resistance, wherein the resistance varies according to a sensed temperature, and a field effect transistor, wherein the field effect transistor allows a current to flow in the heating portion to generate heat according to a level of the resistance of the thermistor.

7. The plasma display panel of claim 6, wherein the heating portion comprises a heat generating body and a controlling portion for controlling the heat generating body to heat only at a predetermined temperature or less.

8. The plasma display panel of claim 7, wherein the controlling portion comprises a circuit portion for allowing a current to flow into the heat generating body according to a sensed temperature.

9. The plasma display panel of claim 6, wherein the protective layer is formed of MgO.

10. The plasma display panel of claim 7, wherein the heat generating body comprises a heat generating coil.

11. The plasma display panel of claim 7, wherein the predetermined temperature is approximately 0° C.

12. A plasma display panel including a rear substrate and a front substrate, wherein the rear substrate is spaced a predetermined distance apart from the front substrate and wherein the rear substrate faces the front substrate, and a plurality of discharge cells are formed between the front substrate and the rear substrate, the plasma display panel comprising:

a heating portion disposed at a rear of the rear substrate to heat the rear substrate and the front substrate, wherein the heating portion comprises a transistor which receives a temperature-dependent signal and regulates a current flowing in the heating portion according the received temperature-dependent signal.

13. The plasma display panel of claim 12, wherein the heating portion further comprises a thermistor which provides the temperature-dependent signal.

14. The plasma display panel of claim 12, wherein the transistor is a field effect transistor.

15. A plasma display panel comprising:

a rear substrate and a front substrate, wherein the rear substrate is spaced a predetermined distance apart from the front substrate and wherein the rear substrate faces the front substrate, and a plurality of discharge cells are formed between the front substrate and the rear substrate:

a plurality of first electrodes formed on an inner surface of the rear substrate;

a first dielectric layer formed on the inner surface of the rear substrate, to cover the plurality of the first electrodes;

a plurality of partitions formed on a surface of the first dielectric layer to define the discharge cells;

a phosphor layer formed on sidewalls of the partitions and on a surface of the first dielectric layer;

a plurality of second electrodes formed on an inner wall of the front substrate, corresponding to the plurality of the first electrodes;

a second dielectric layer formed on the inner wall of the front substrate to cover the plurality of the second electrodes;

a protective layer formed on a surface of the second dielectric layer; and a heating portion disposed at a rear of the rear substrate to heat the rear substrate and the front substrate, wherein the heating portion comprises a transistor which receives a temperature-dependent signal and regulates a current flowing in the heating portion according the received temperature-dependent signal.

16. The plasma display panel of claim 15, wherein the heating portion further comprises a thermistor which provides the temperature-dependent signal.

17. The plasma display panel of claim 15, wherein the transistor is a field effect transistor.

* * * * *